United States Patent [19]
Gupta et al.

[11] Patent Number: 5,329,487
[45] Date of Patent: Jul. 12, 1994

[54] TWO TRANSISTOR FLASH EPROM CELL

[75] Inventors: Anil Gupta, San Jose; Kuo-Lung Chen, Saratoga, both of Calif.

[73] Assignee: Altera Corporation, San Jose, Calif.

[21] Appl. No.: 28,042

[22] Filed: Mar. 8, 1993

[51] Int. Cl.$^5$ .............................................. G11C 11/40
[52] U.S. Cl. ................................ 365/185; 365/174; 365/218
[58] Field of Search .................. 365/185, 218, 174

[56] References Cited

U.S. PATENT DOCUMENTS

| | | | |
|---|---|---|---|
| 4,403,307 | 9/1983 | Maeda | 365/174 |
| 5,220,533 | 6/1993 | Turner | 365/185 |

OTHER PUBLICATIONS

Pathak et al., "A 25ns 16K CMOS PROM using a 4-Transistor Cell," *Session XIII: Nonvolatile Memories—ISSCC 1985*, Feb. 14, 1985, pp. 162–164.

Pathak et al., "A 19ns 250mW Programmable Logic Device," *Session XVIII: Logic Arrays and Memories—ISSCC 1986*, Feb. 21, 1986, pp. 246–247.

Samachisa et al., "A 128K Flash EEPROM using Double Polysilicon Technology," *Session VII: Nonvolatile Memory—ISSCC 1987*, Feb. 25, 1987, pp. 76–77.

Kynett et al., "A 90ns 100K Erase/Program Cycle Megabit Flash Memory," *Session 10. Nonvolatile Memories—ISSCC 1989*, Feb. 16, 1989, pp. 140–141.

*Primary Examiner*—Eugene R. LaRoche
*Assistant Examiner*—Christopher R. Glembocki
*Attorney, Agent, or Firm*—Townsend and Townsend Khourie and Cres

[57] ABSTRACT

A two-transistor flash EPROM cell includes a first floating gate transistor for programming the cell and a second merged transistor for reading the cell. The first transistor, a floating gate transistor, has a drain coupled to the write bit line, a gate coupled to the word line, and a source coupled to the source line. The merged transistor effectively consists of a floating gate transistor in series with a NMOS enhancement transistor. The series NMOS transistor has a voltage threshold of about 1 to 2 volts, thus preventing cell activation caused by over-erasure (negative voltage threshold) of the floating gate transistor.

12 Claims, 3 Drawing Sheets

TWO TRANSISTOR FLASH EPROM CELL

BACKGROUND OF THE INVENTION

This invention relates generally to memory and programmable logic devices having electrically programmable memory cells, and more specifically, to an improved two-transistor flash EPROM cell which prevents negative voltage thresholds after cell erasure and prevents conduction paths through the cell during programming subsequent to an erasure.

It is often desirable in digital systems to include memory which may be programmed in the field by the customer and later reprogrammed if necessary. It is also desirable to provide such programmable memory in a form where the information is stored in a nonvolatile manner, that is, in a manner where power is not required to maintain the stored information. Previously, fusible programmable logic devices were used to provide this on-site programmability. Because these devices relied on the physical destruction of fuses, however, reprogramming the memory device was impossible.

A family of devices, known as EPROMs, dependent upon avalanche charge injection or "hot" injection onto a floating-gate has evolved. In EPROMs, under the influence of a high applied drain voltage, charge collects on the floating gate where it is trapped by surrounding oxide insulation. The cell is erased by ultraviolet light which increases the energy of the floating gate electrons enabling them to jump the energy barrier and dissipate.

Another family of devices, known as EEPROMs or E$^2$PROMs can be electrically programmed and electrically erased. The basic technologies used to make E$^2$PROMs today typically rely on Fowler-Nordheim tunnelling, which is cold electron tunnelling through the energy barrier at a silicon-silicon dioxide interface. A thin oxide layer is required for this process. Flash EPROMs can be electrically programmed and electrically erased, yet typically allow a smaller memory cell size compared to the E$^2$PROM cell.

Programming flash EPROMs relies on charge injection. FIG. 1 is a schematic drawing of a small portion (4 cells) of a flash EPROM array such as in products sold by Intel Corporation. To program a flash EPROM cell 110, a high voltage is applied to the word line 112 to thereby raise the potential of gate 115. A high voltage is also applied to drain 114 of the cell to be programmed. This places a charge on the floating gate 118, adjusting the threshold voltage of the cell. Unlike the conventional EPROM cell which is erased by ultraviolet light, however, erasure of the cell 110 is dependent on Fowler-Nordheim tunneling. During erasure, the gate 115 of the flash EPROM cell is grounded, the source 116 is raised to a high voltage, and the drain 114 is allowed to float. These conditions allow charge on the floating gate to tunnel through the floating gate oxide and dissipate, leaving the floating gate unprogrammed.

Unfortunately, one of the problems associated with E$^2$PROM cells not found in conventional EPROM cells is the tendency for the voltage threshold of the device to become negative after erasure. This phenomenon does not occur in conventional EPROMs, where the floating gates return to the original voltage (zero volts) after erasure. In the flash EPROM cell, overerasure can leave the floating gate charged, resulting in a negative voltage threshold. A negative voltage threshold can prevent later accurate reading of the cell by the sense amplifier (coupled to drain 114). Typically when reading a particular cell 110 in a memory array, a logical "one" level is applied to the cell word line 112 for the row in which a cell is to be read and a logical zero level is applied to all other cell word lines, i.e., word lines not having the cell to be read. If the voltage threshold of the cell 110 which is to be read, however, is negative after the erasure, application of a low or zero voltage to the word line 112 will result in the overerased cell in word line 112 being turned on, which can prevent the sense amplifier from sensing a voltage differential. Thus, the sense amplifier may not be able to recognize the programming of which cell is on and may not be able to read a correct voltage.

Different flash EPROMs combat the problem of negative threshold voltage in a variety of ways. At the 1989 IEEE International Solid State Circuit Conference Session of Non-volatile Memory, a paper entitled "Nonvolatile Memories," by Kynett, et al., described a flash memory which controls the memory array erase threshold voltage by using an erase algorithm. Instead of using a single fixed pulse erase voltage, the described device changes the voltage pulse according to an erase algorithm to prevent overerasure.

A flash E$^2$PROM memory cell developed by Seeq Technology is shown in FIG. 2 and was described in the 1987 IEEE International Solid State Circuit Conference, Session VII of Non-volatile Memory. See "A 128K Flash EEPROM Using Double Polysilicon Technology," by Samachisa, et al. The flash E$^2$PROM transistor cell 210 is an integrated circuit structure which merges a floating gate transistor 212 in series with a NMOS transistor 214. If the erase voltage threshold of the floating gate transistor 212 becomes negative, the application of zero volts to the control gate of transistor 212 typically would turn on the transistor. Because of the NMOS transistor 214 in series with the floating gate transistor 212, however, the cell 210 has a voltage threshold of about +1 volt, and the cell 210 will not be turned on.

Although the Seeq flash E$^2$PROM solves the negative threshold voltage problem, there are problems associated with such a cell. Programming the Seeq flash E$^2$PROM device relies upon hot electron injection which is strongly dependent on the effective channel length. Dependency on the channel length is problematic because the channel in the Seeq transistor is not self-aligned, increasing the probability of punchthrough or longer programming times. Furthermore, the series NMOS transistor 214 adds to the cell resistance. This increased resistance makes hot electron programming more difficult, increasing the time needed to program the device.

Accordingly, a flash EPROM cell which decreases the time needed to program the cell, and which prevents a negative voltage threshold is needed.

SUMMARY OF THE INVENTION

According to our invention a two-transistor flash memory cell consists of a first floating gate transistor for programming the cell, and a second merged transistor for reading the cell. The first transistor is a floating gate transistor which has a drain coupled to a write line and a source coupled to a source line. The second transistor is a merged transistor consisting of a floating gate transistor in series with a NMOS enhancement mode transistor. The NMOS transistor typically has a voltage threshold in the range of 1 to 2 volts and, as will be explained, prevents cell activation caused by overerasure (negative voltage threshold) of the floating gate transistor.

The merged transistor has a drain coupled to a read bit-line, a gate to the word line, and a source connected to the source line. The floating gate of the first floating gate transistor is coupled to the floating gate of the second merged transistor, and the source of the first floating gate transistor is coupled to the source of the second merged transistor. (As will be described, the floating gates of the two devices are formed from a single polysilicon region, and the sources of the two transistors are formed from the same diffusion.) The gate of the merged transistor is symmetrically aligned with the floating gate, decreasing alignment sensitivities of the cell. Decreasing alignment sensitivities provides a decrease in variations of the coupling ratio. This enables an equal amount of charge to be stored in each cell in the memory array, and reduces variation from one wafer batch to another.

Programming the two-transistor flash memory cell is controlled by the first transistor while the read operation is controlled by the second transistor. Thus, the series resistance present in the merged transistor is not added to the cell resistance while programming. The decreased resistance decreases the time necessary for programming the cell, increasing programming speed.

DESCRIPTION OF THE SPECIFIC EMBODIMENT

Figure 3:
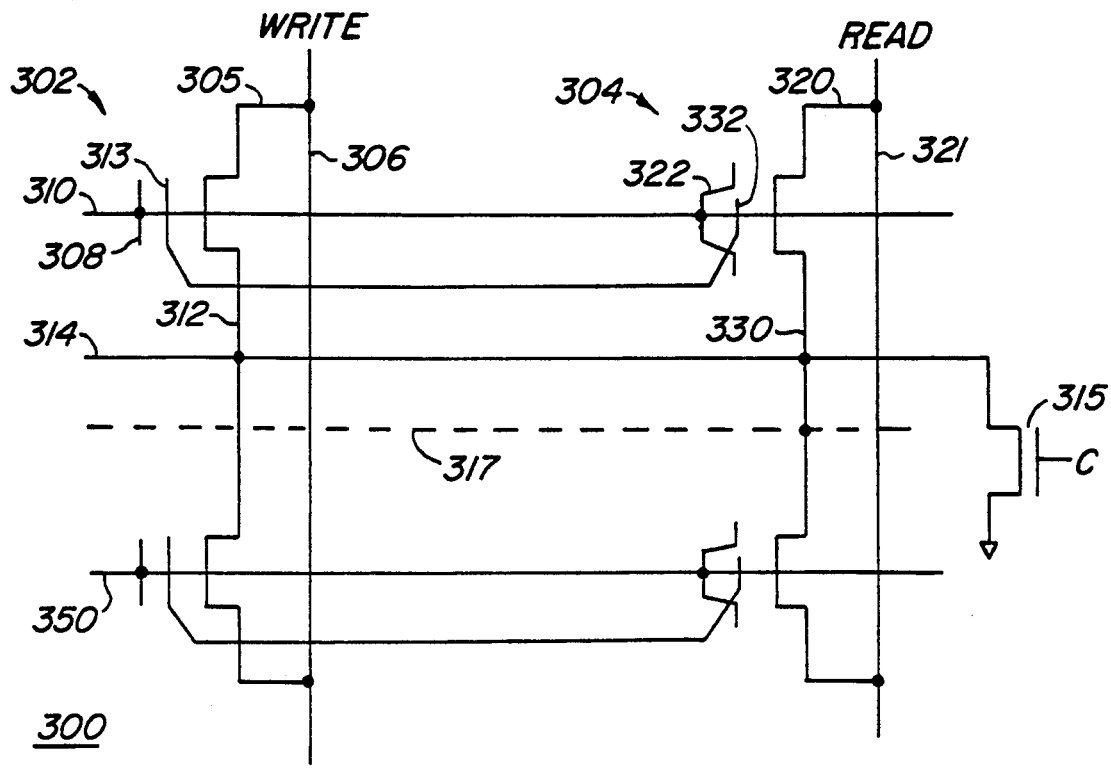
FIG. 3 is a schematic diagram illustrating a cell of a flash memory array according to the preferred embodiment of this invention.

FIG. 3 is a schematic diagram illustrating a pair of cells 300 of an EPROM array according to the preferred embodiment of the present invention. One flash memory cell includes two transistors: a floating gate transistor 302 used for programming the memory cell and a merged transistor 304 used for reading the cell. Transistor 302 is a floating gate transistor which has a drain 305 coupled to a write bit-line 306, a cell selection gate 308 coupled to a word line 310, and a source 312 coupled to the source line 314. Floating gate 313 is also shown.

The merged transistor 304 has its drain 320 coupled to the read bit-line 321, its gate 322 coupled to the word line 310, and its source 330 tied to the source line 314. In some embodiments of the invention an additional (separate) source line 317 is provided for merged transistor 304. Such an embodiment is shown by the dashed line in FIG. 3. The use of a separate source line for the read and write transistors enables the use of current limiters on the read transistor while still allowing the write transistor to be connected to "hard" ground for improved programmability. The floating gate 313 of transistor 302 is commonly formed with, and thus connected to, the floating gate 332 of the merged transistor 304. The source 312 of transistor 302 is commonly formed with and thus connected to the source 330 of the transistor 304. Transistor 315 coupled to source line 314 is an optional device employed in some embodiments of the invention. Its function is discussed later below.

Figure 1:
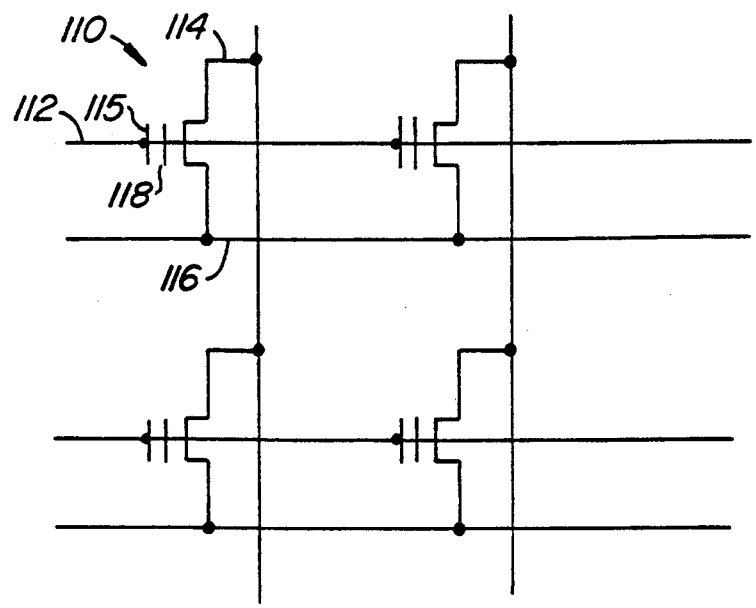
FIG. 1 is a schematic drawing of a prior art one-transistor cell flash EPROM array.
Figure 2:
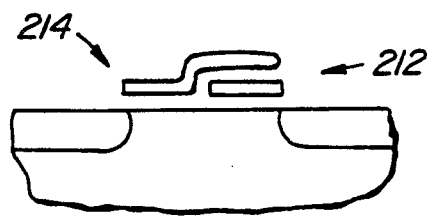
FIG. 2 is a cross-sectional view of a flash E²PROM cell which includes a series transistor and a floating gate transistor.
Figure 4:
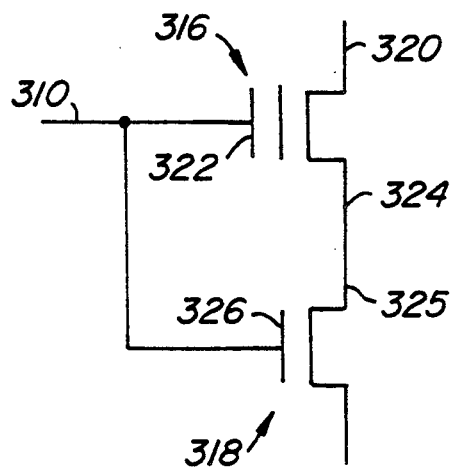
FIG. 4 is a schematic diagram to explain the operation of the merged transistor of the flash memory cell shown in FIG. 3.

The functionality of the merged transistor 304 of a cell is schematically represented in FIG. 4. The physical structure of the merged transistor is shown in detail in FIGS. 7 and 8. Although formed as a unitary structure, the merged transistor 304 can be considered to be a floating gate transistor 316 in series with a NMOS enhancement transistor 318. Considered as such, the drain 320 of the floating gate transistor 316 in merged transistor 304 is connected to the read bit-line 321, the cell selection gate 322 is connected to the word line 310, and the source 324 is connected to the drain 325 of the NMOS enhancement transistor 318. Gate 326 of transistor 318 is connected to the gate 322 of the floating gate transistor 316. Thus, effectively both the cell selection gates of the floating gate transistor 316 and enhancement type transistor 318 are connected to the word line 310. The source 330 of the merged transistor 304 is connected to the source line 314.

Merged transistor 304 functions to keep the memory cell off when a negative voltage threshold for floating gate transistor 302 occurs. The enhancement type NMOS transistor 318, essentially a portion of transistor 304, typically has a gate voltage threshold in the range of 1 to 2 volts. Because the floating gate transistor 316 is effectively in series with NMOS transistor 318, even if a zero or low voltage turns on the floating gate transistor 316, the NMOS enhancement transistor 318 prevents the cell from being turned on and supplying bad data.

Programming the memory cell is similar to programming a standard EPROM cell. Electron transfer to the floating gate 313 is induced by a high voltage, typically about 9 volts, applied via write line 306 to the drain 305 of transistor 302 simultaneously with the application of a high voltage (typically 12–15 v) to the word line 310 to gate 308. A low voltage is applied to the drain 320 of the merged transistor 304. The sources 312 and 330 are held at ground using source line 314.

Applying a high voltage to the gate 308 and drain 305 of transistor 302 turns transistor 302 on creating a channel where a relatively large drain current flows. This places electrons on the floating gate 313. Because the floating gates 313 and 332 are coupled, both become charged.

The read operation for the flash memory cell shown in FIG. 3 is controlled by transistor 304 and is similar to reading standard EPROM devices. To read the memory cell 300, the word line 310 is brought to a logical one voltage level, typically about 5 volts, while the source line 314 is held at a low voltage or zero. The write line 306 is held to a low voltage level or allowed to float, while the potential of the read line is sensed.

If a "one" was stored on the floating gate 332 of the merged transistor 304, then the negative charge on the floating gate forces its potential to about −5 volts. Because the reading voltage is typically 5 volts, a channel never forms and a sense amplifier (not shown) senses a one stored in the cell. In the alternative, if a "zero" was stored on the floating gate, application of the 5 volt reading voltage results in channel formation. Thus, the sense amplifier senses a zero stored in the memory cell 300.

Conventional EPROM memory cells are erased by exposing the cell to strong ultraviolet (UV) light. Exposure to UV radiation renders the silicon dioxide isolation of the floating gate slightly conductive by generation of electron hole pairs in the silicon dioxide. Unlike EPROM where erasure is dependent on UV light exposure, erasure of the cell of our invention is done electrically and is dependent upon Fowler-Nordheim tunneling.

The erase operation for the flash cell is controlled by the first transistor 302. To erase the memory cell, the word line 310 is brought to a low or zero voltage, read and write lines 321, 306 are allowed to float, and the source line 314 voltage is raised to a high value, typically about 13 volts or higher. This causes electrons to flow from the floating gate 313 of transistor 302 across the dielectric separating the floating gate and the body of the transistor to the transistor sources 312 depleting the charge on the floating gate. Tables 1, 2 and 3 below summarize the write, read and erase conditions for both selected cells and nonselected cells.

TABLE 1

| | Write | |
| --- | --- | --- |
| | Selected | Nonselected |
| Word line | High (12–15 v) | Low |
| Write line | 9 v | Low |
| Read line | Low | Low |
| Source line | Ground | Ground |

TABLE 2

| | Read | |
| --- | --- | --- |
| | Selected | Nonselected |
| Word line | 5 v | Low |
| Write line | Low or float | Low |
| Read line | Sense | Float |
| Source line | Low | Low |

TABLE 3

| | Erase | |
| --- | --- | --- |
| | Selected | Nonselected |
| Word line | Low (ground) | Low |
| Write line | Float | Float |
| Read line | Float | Float |
| Source line | 13 v | Low |

Thus far, we have discussed prevention of over-erase conditions for the read transistor. It is also possible, however, for the write transistor to become over-erased and provide an undesired conduction path. As an example of this circumstance, consider the circuit shown in FIG. 3. After erasure, if the threshold of the write transistor 302 becomes negative, it will provide a conduction path through the cell even when its gate is held at logical zero level, that is, deselected. If there are numerous such cells on the chip providing this spurious condition on a given write bit/column line, the added current path will make it prohibitive to hold a high voltage (9 volts as shown in Table 1 above) on the write bit line.

We have developed two techniques for preventing over-erasure of the write transistor from adversely impacting device performance. The two techniques are both shown in FIG. 3, but it should be understood that either may be employed separately, or, in appropriate circumstances neither used.

The first technique for preventing over-erasure of the write transistor from impacting device performance is to add a transistor 315 to the common source line for every pair of word lines. Transistor 315 switchably connects source line 314 to ground in response to control signal C. During programming the truth table for transistor 315, the state of control signal C is given by Table 4 below. During read operations transistor 315 will be on, helping to pull the source line low. For erase, transistor 315 is off.

TABLE 4

| | Transistor 315 | |
| --- | --- | --- |
| Word Line 310 | Word Line 350 | Control Signal C |
| High | Low | High |
| Low | High | High |
| Low | Low | Low |

When transistor 315 is on, if any cell coupled to either of the word lines to which it is connected is being programmed, the spurious conduction path is limited to a single cell. This low level of conduction is acceptable.

Figure 10:
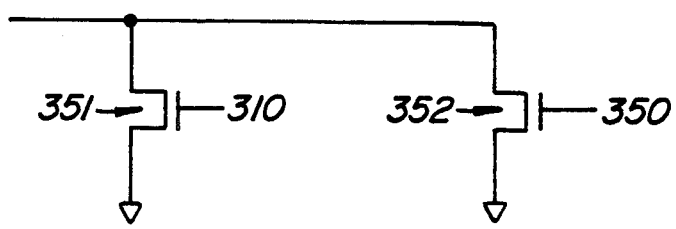
FIG. 10 is a schematic drawing of alternate approach to transistor 315 in FIG. 3

In another embodiment transistor 315 can be replaced with transistors 351, 352 (FIG. 10). This embodiment does not require generation of a control signal in program, erase or read modes.

A second technique for preventing conduction paths through the write transistors is to increase the threshold voltage of the write transistor. By increasing the $V_T$ of the write device, it becomes more difficult for that transistor to go into depletion after erasing. This can be achieved by well known changes to the process for forming the write device, for example, by implanting the channel or varying its gate oxide thickness. Of course, such threshold adjustments only make it more difficult to be placed in depletion, as opposed to totally precluding depletion. If the threshold voltage is adjusted, for example, upward from 2–4 volts, then a slightly higher programming voltage (14–17 volts) will be required.

Figure 5:
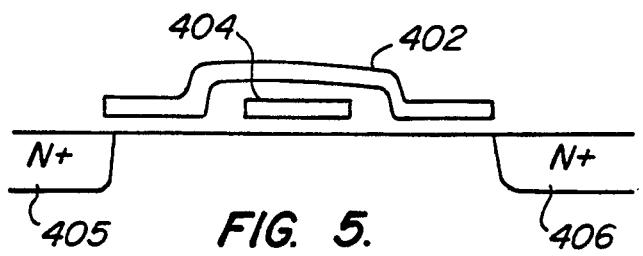
FIG. 5 is a cross-sectional view of the merged transistor illustrated in FIG. 4.
Figure 6:
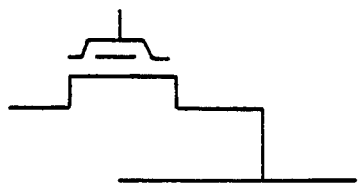
FIG. 6 is a schematic drawing of the merged transistor shown in FIG. 5.
Figure 7:
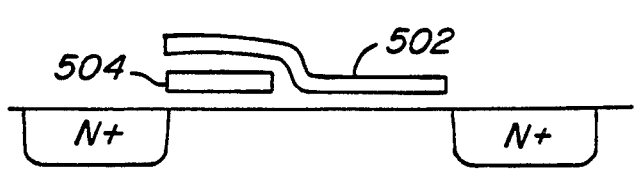
FIG. 7 is a cross-sectional view of an alternative embodiment for the merged transistor shown in FIG. 3.
Figure 8:
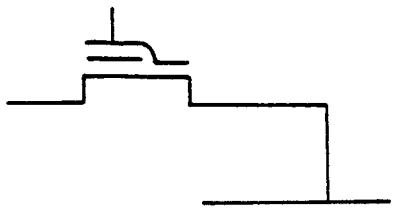
FIG. 8 is a schematic drawing of the merged transistor shown in FIG. 7.

FIGS. 5 and 7 are cross-sectional diagrams of two embodiments of a merged transistor 304 according to the present invention. FIGS. 6 and 8 are schematic diagrams of the merged transistor corresponding to the cells illustrated in FIGS. 5 and 7, respectively.

The merged transistor 304 is effectively two transistors in series, one transistor with a floating gate, the other without. In a typical floating gate transistor, for example transistor 302, the cell selection gate is aligned with the floating gate and both the floating gate and cell selection gate have approximately the same planar dimensions. The merged transistor shown in FIG. 5 has a cell selection gate 402 which is clearly different in length than the floating gate 404. Unlike conventional floating gate transistors, the floating gate of the merged transistor of FIG. 5 does not extend from the source 405 to the drain 406. The cell selection gate 402 not only extends over the floating gate 404, but also extends over the channel between the source 405 and drain 406 regions of the transistor. Thus, control of the channel potential is dependent on two transistors, one in the region having a floating gate, the second in a region without a floating gate.

Unlike the embodiment shown in FIG. 5, the cell selection gate 502 of the merged transistor shown in FIG. 7 is not symmetrically aligned over the floating gate 504. Instead, only one edge of the cell selection gate 502 is aligned with floating gate 504. The coupling ratio between the cell selection gate and the floating gate determines the amount of charge transferred to the floating gate. The coupling ratio is sensitive to alignment between the cell selection and floating gate. Because it is desirable to have a consistent amount of charge delivered to the floating gates of selected cells, the two gates preferably are aligned so that offset caused by processing inconsistencies affects the coupling between them the least. Thus, although the embodiment shown in FIG. 7 is functionally equivalent to the embodiment shown in FIG. 5, the embodiment shown in FIG. 5 is preferred because of its relative alignment insensitivity.

The different memory cell semiconductor structures of our invention may be formed using well known process technology. In the preferred embodiment we employ a conventional self-aligned polycrystalline silicon floating gate CMOS process such as is widely used in the semiconductor industry. Well known doping profiles are used for sources 312, 330 to provide high voltage tolerance during erase operations.

Figure 9:
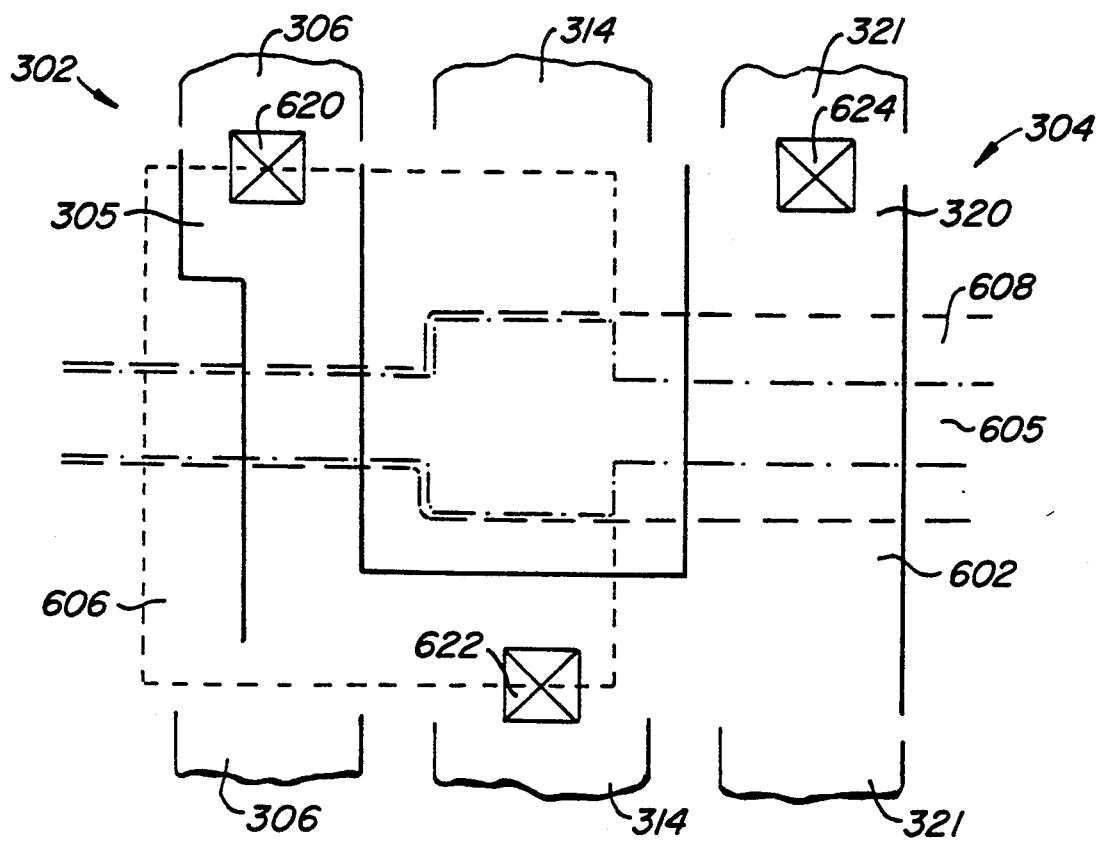
FIG. 9 is a top view of a preferred embodiment of a memory cell according to my invention.

FIG. 9 is a top view of a preferred embodiment of a two-transistor flash memory cell of the preferred embodiment. The merged transistor 304 is on the right, while the floating gate transistor is on the left. A solid line denotes the active area 602. Outside the active area 602, silicon dioxide isolation is provided to electrically isolate individual cells in the memory array from each other. The floating gate common to both devices is formed by polycrystalline silicon region 605 denoted by a dotted dashed line in the ultimate structure. To self-align the floating gate 605 to the control gate 608, when the floating gate 605 is first formed, it is larger than necessary. This larger polysilicon layer is denoted by the dotted region 606. Once the control gate polysilicon is deposited and masked to form region 608, that layer 608 is used to mask the lower polysilicon 605 to self-align it with the control gate 608. Of course, self-alignment is not needed in the merged transistor gate structure, as shown most clearly in FIG. 5.

After definition of the polysilicon gates 308, 322, a diffusion is made into the active area to create the source and drain regions. After formation of suitable insulation, metal lines 306, 314 and 321 may be formed. Metal line 306 serves as the write line (see FIG. 3) and a contact 620 connects line 306 to the drain region of transistor 302. Contact 622 connects metal source line 314 and the source diffusion in active area 602. Finally, contact 624 connects read line 321 to drain 320.

If the transistor 315 is employed to prevent conduction paths through the memory array, then source line 314 can be fabricated in another layer of metal or polysilicon extending horizontally (with respect to FIG. 9). For the circumstance in which separate source lines are used, then two line widths spacing can be employed between lines 306 and 321 to provide space for the additional line.

Although the invention has been particularly shown and described in reference to the preferred embodiment, it is understood by those skilled in the art that changes in form and detail may be made without departing from the spirit of this invention. It is therefore intended that the scope of the invention be limited only by the appended claims.

We claim:

1. A memory cell comprising:
   a word line;
   a write line;
   a read line;
   a first transistor having a gate connected to the word line, a drain to the write line, a source, and a floating gate; and
   a second transistor having a gate connected to the word line, a drain connected to the read line, a source and a floating gate connected to the floating gate of the first transistor,
   wherein the floating gate of the second transistor does not extend to either of the source and the drain of the second transistor.

2. A cell as in claim 1 wherein the source of the second transistor is connected to the source of the first transistor.

3. A cell as in claim 1 wherein the second transistor comprises a merged transistor.

4. A cell as in claim 3 wherein the merged transistor includes a floating gate transistor and a field effect transistor.

5. A cell as in claim 4 wherein the field effect transistor comprises an enhancement type transistor.

6. A memory cell as in claim 1 wherein the first transistor has a threshold voltage which is different from a threshold voltage of the second transistor.

7. A plurality of memory cells as in claim 1 interconnected to form an array.

8. An array as in claim 7 wherein:
   the sources of the groups of the first transistors are connected together to a node; and
   an additional transistor is coupled to the node and to a potential source to switchably connect the node to the potential source.

9. In a flash electrically erasable programmable read only memory having word lines, write lines, read lines, and source lines, and having two-transistor memory cells with a merged transistor having a gate symmetrically aligned with a floating gate, a method of storing data in a selected memory cell comprising contemporaneously:
   applying a first high potential to a write line coupled to the selected cell;
   applying a second high potential to a word line coupled to the selected cell;
   applying first low voltage to a read line coupled to the selected cell; and
   applying a second low voltage to a source line coupled to the selected cell.

10. A method as in claim 9 further comprising reading the stored data from the selected cell by contemporaneously:
   applying a logical one voltage level to the word line coupled to the selected cell;
   applying a low voltage to the source line; and
   detecting the potential of the read line coupled to the selected cell.

11. A nonvolatile memory cell less susceptible to overerasure comprising:

a first transistor having a gate, a floating gate, a source and a drain;

a second transistor having a gate connected to the gate of the first transistor, a floating gate connected to the floating gate of the first transistor, a source connected to the source of the first transistor, and a drain; and wherein the floating gate of the second transistor does not extend to either of the source and the drain.

12. The nonvolatile memory cell of claim 11 wherein the floating gate of the second transistor is symmetrically aligned with the gate of the second transistor.

* * * * *